United States Patent [19]
Dean et al.

[11] Patent Number: 5,903,441
[45] Date of Patent: May 11, 1999

[54] METHOD AND APPARATUS FOR ALIGNING A PRINTED CIRCUIT BOARD WITH A CHASSIS

[75] Inventors: Ronald P. Dean; David Mayer, both of Fort Collins, Colo.

[73] Assignee: Hewlett-Packard Company, Palo Alto, Calif.

[21] Appl. No.: 08/937,108

[22] Filed: Sep. 24, 1997

[51] Int. Cl.[6] .............................. H05K 7/14; H05K 1/00
[52] U.S. Cl. .................... 361/756; 361/759; 361/802; 361/748; 174/254
[58] Field of Search ................................. 361/748, 749, 361/756, 759, 802, 753; 439/61; 174/250, 254

[56] References Cited

U.S. PATENT DOCUMENTS

| | | | |
|---|---|---|---|
| 4,470,100 | 9/1984 | Rebaudo et al. ..................... | 361/749 X |
| 4,885,430 | 12/1989 | Kinser, Jr. et al. ..................... | 361/749 |
| 5,495,076 | 2/1996 | Davis ................................... | 361/749 X |

Primary Examiner—Leo P. Picard
Assistant Examiner—Jayprakash N. Gandhi
Attorney, Agent, or Firm—Cynthia S. Deal

[57] ABSTRACT

An electronic device having a printed circuit board that must align with and connect to various devices on more than one edge of the printed circuit board. The printed circuit board having an isolation slot that creates a peninsula connection region near one edge of the printed circuit board to enable the printed circuit board to be readily aligned inside the electronic device with the various devices that the printed circuit board mates with. The present invention may also include a travel limit bracket attached to the printed circuit board on either side of the isolation slot in order to limit the amount of travel and twisting of the peninsula connection region. The printed circuit board may also include insertion guide that guide the printed circuit board as it is being mated with a front panel of the electronic device. The printed circuit board of the present invention may also include a photo diode switch means that prevents the electronic device from being turned on unless the printed circuit board is properly installed and the front panel is properly mated with the printed circuit board.

5 Claims, 9 Drawing Sheets

METHOD AND APPARATUS FOR ALIGNING A PRINTED CIRCUIT BOARD WITH A CHASSIS

FIELD OF THE INVENTION

The present invention relates generally to the field of printed circuit boards and more particularly to a method for providing proper feature alignment between a printed circuit board within a computer chassis and other features within the computer chassis.

BACKGROUND OF THE INVENTION

A printed circuit board in a computer chassis is typically connected to various devices within the computer chassis and also to various devices outside of the computer chassis, such as a power cable, a monitor, a modem, a fax machine, a hard drive, a CD ROM, a floppy disk drive, a scanner, a printer, a mouse, a key board, power on/off switch, key board lock button, audio headset connections, microphone connector, volume control knob, etc.

These connections between the printed circuit board and other devices require precise alignment between the printed circuit board connectors and the various device connectors. As a printed circuit board is connected on more than one edge of the board to ever more devices, the alignment issue becomes more critical.

For example, a typical printed circuit board must align with holes in the back side of the computer chassis in order to make connections to a power supply, a monitor, a modem, a printer, a mouse, a keyboard, a back plane board and other I/O devices, while at the same time align with holes in the front or side of the computer chassis to connect with audio headsets and microphone devices, and to allow for various user interface devices, such as a power on/off button, a mute button, a volume control knob, a keyboard lock button, etc. A printed circuit board will usually also connect to various internal devices, such as a hard drive, a CD ROM, a floppy disk drive, etc.

In order for the printed circuit board to connect to many different devices on more than one edge of the printed circuit board, prior solutions to the alignment issue have included precise manufacturing alignment requirements between the printed circuit board, the computer chassis and the different devices to be connected; using separate boards and cable assemblies to accommodate the various connections to different devices; utilizing relatively fragile printed circuit board extensions; eliminating tolerance stack-ups, such as tight tolerance, precision made components by means of highly tooled, precision manufacturing processes. Many of these solutions add to engineering, manufacturing and tooling costs, increase the overall size of the computer chassis, increase the number of parts and add to the cost and complexity of assembly and disassembly.

If the printed circuit board does not align with all of the connections on each edge of the printed circuit board, either one or more of the connections will not be able to be made, or the connections will be forced and will create a torsional twisting of the printed circuit board. Such twisting of the printed circuit board could cause lifting of traces, leads and solder, causing opens in the circuitry on the printed circuit board. Accordingly, there is a need in the field of computer and electronic assemblies for an inexpensive, simple means of alignment between the printed circuit board and the various devices being connected to the printed circuit board. There is a further need for a means of alignment between a printed circuit board and the various devices connected to the printed circuit board that does not significantly add parts, weight or assembly and disassembly complexity or cost.

SUMMARY OF THE INVENTION

The present invention overcomes the disadvantages of the prior art by providing a means of alignment between a printed circuit board and the computer chassis the printed circuit board is attached to and the various devices the printed circuit board is connected to. The printed circuit board is made of a rigid material with connection means on more than one edge and at least one isolation slot between the connections means on at least one edge of the printed circuit board and the main area of the printed circuit board. The isolation slot is designed to allow the connection means of the printed circuit board to deflect and conform to any manufacturing misalignment of the computer chassis into which the printed circuit board is mounted.

The isolation slot creates an isthmus that connects the main area of the printed circuit board to a peninsula of the printed circuit board, the peninsula having the connection means attached thereto. The isthmus allows for a limited amount of movement and twisting of the peninsula relative to the main body of the printed circuit board. A bracket may also provide travel limit stops, thus controlling how far the peninsula may be twisted relative to the main body of the printed circuit board in order to prevent damage to traces, electronic devices, circuitry or the printed circuit board itself. Alignment forks may also provide guidance to the printed circuit board and the peninsula as it is being connected to mating features. Accordingly, the present invention allows the printed circuit board to be mounted in a computer chassis that may be twisted or have mounting, mating, and connection features that are not co-planar or precisely aligned with the mating, mounting and connection features of the printed circuit board without high precision manufacturing requirements.

BRIEF DESCRIPTION OF THE DRAWINGS

The above and other objects, features and advantages of the present invention will be better understood by reading the following more particular description of the invention, presented in conjunction with the following drawings, wherein.

DETAILED DESCRIPTION OF THE PREFERRED EMBODIMENT

Figure 1:
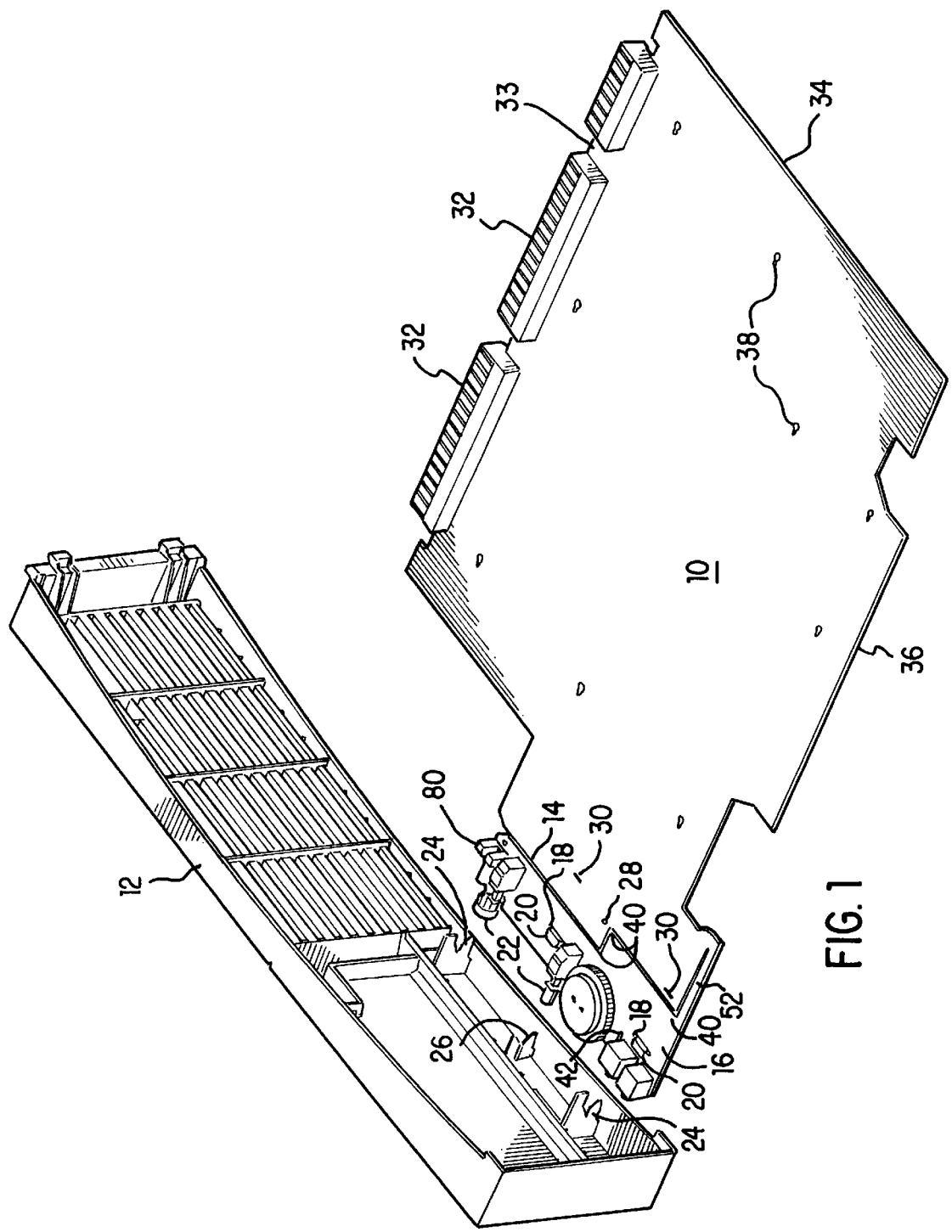
FIG. 1 shows an exploded, top isometric view of a printed circuit board being mounted to the front panel of a computer chassis according to a first embodiment of the present invention.
Figure 2:
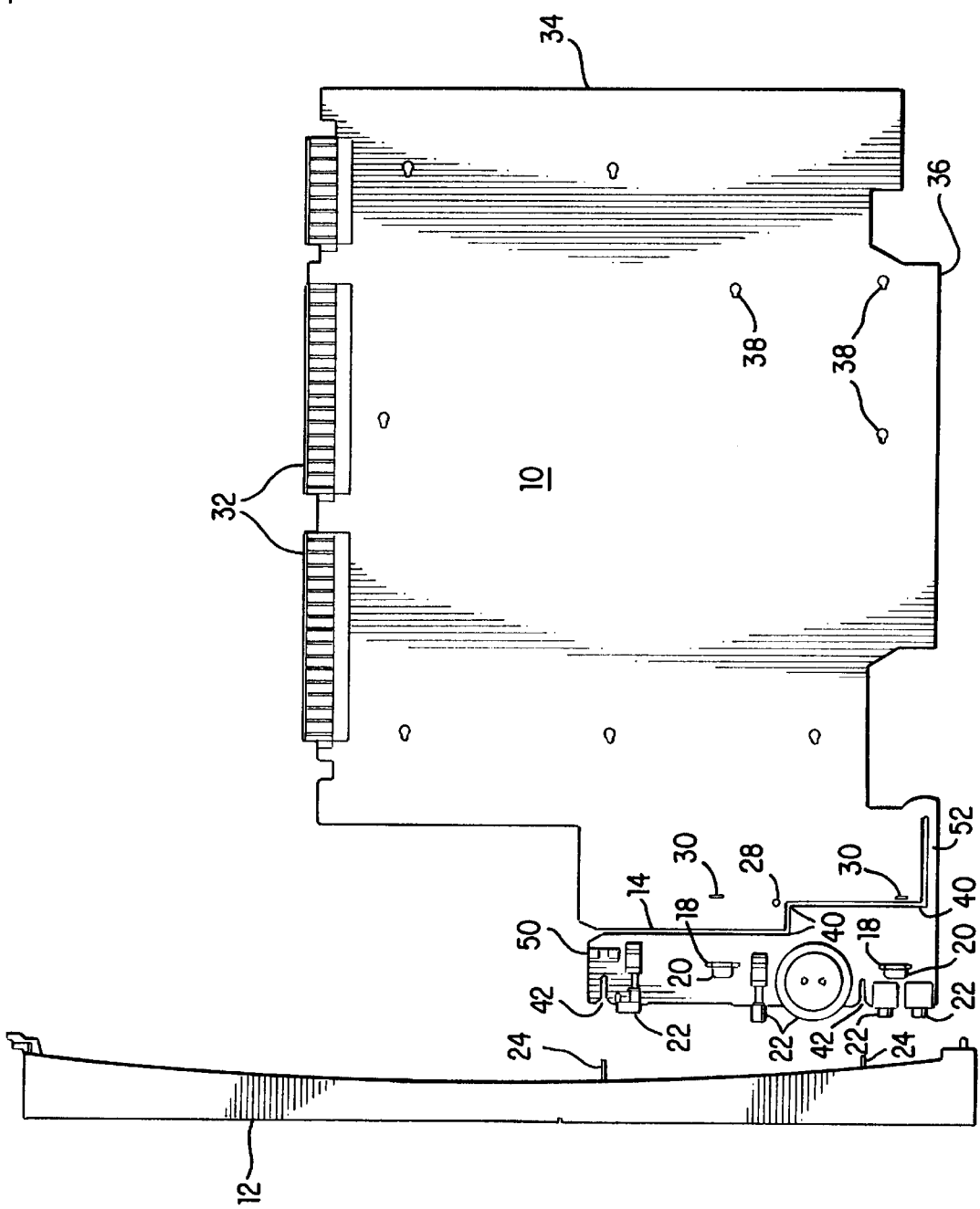
FIG. 2 shows a top view of the printed circuit board being mounted to the front panel of a computer chassis according to the first embodiment of the present invention.

FIGS. 1–5 show a printed circuit board 10 with an isolation slot 14 and a peninsula 16 according to a first embodiment of the present invention. Peninsula 16 has connection and user interface buttons 22 mounted thereon. The connection and user interface buttons 22 will mate with holes in the front panel 12 of a computer chassis (not shown). Printed circuit board 10 may be mounted in a computer chassis (not shown) with various connections 32 at sides 33, 34, and 36 and with holes 38, besides the various connections 22 made along the front panel 12 of the computer chassis. Many of the connections 32 and 38 made between the printed circuit board 10 and the computer chassis (not shown) and the various components inside and outside of the computer chassis will be relatively rigid connections. Therefore, the printed circuit board 10 will be held relatively securely in place within the computer chassis (not shown).

Figure 5:
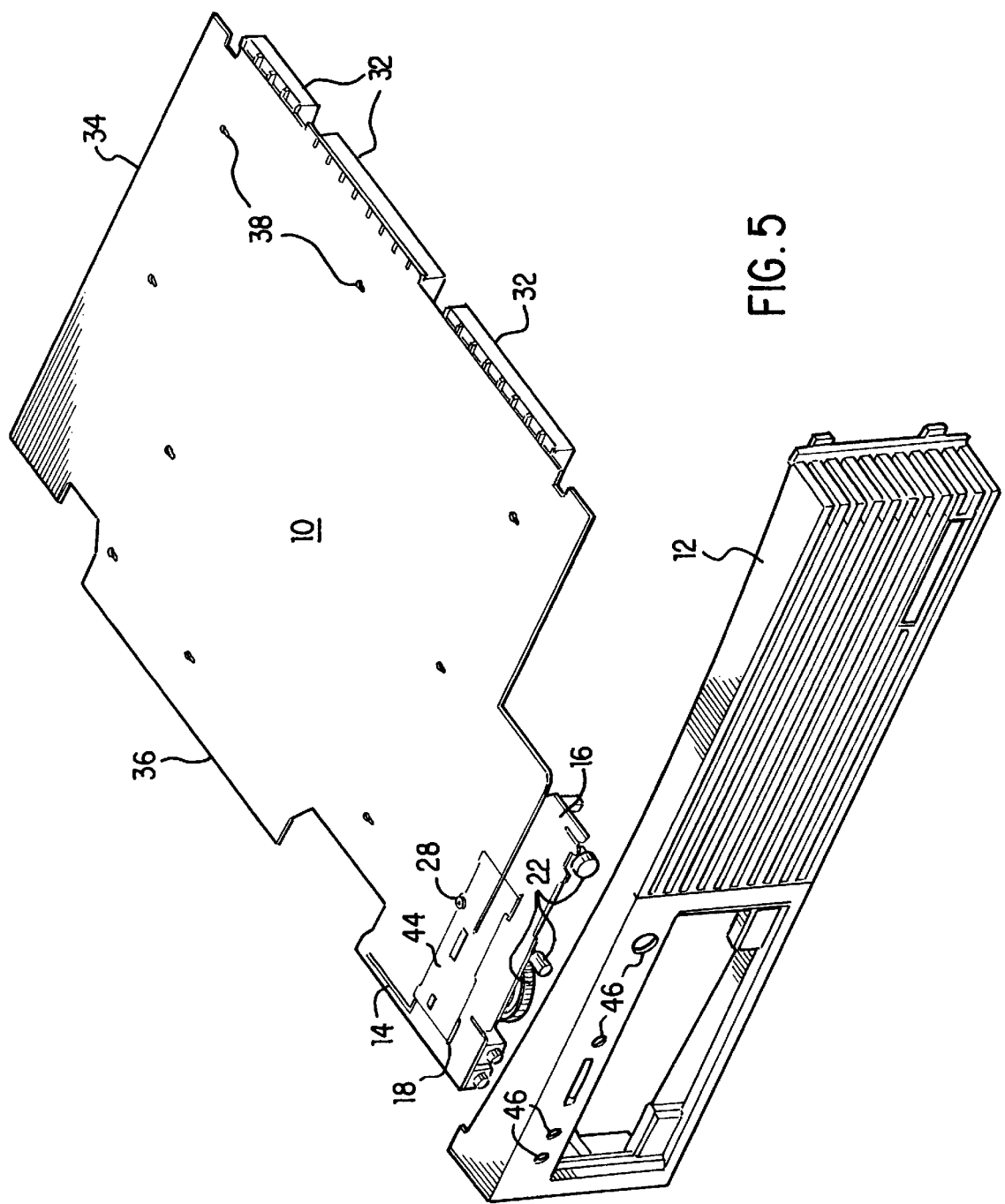
FIG. 5 shows a bottom, front isometric view of the printed circuit board with a travel limit stop bracket being mounted to the front panel of a computer chassis according to the first embodiment of the present invention.

The isolation slot 14, and more particularly, the bending of the isthmus 52 created by the isolation slot 14, permits a limited amount of movement, flexibility and twisting of the peninsula 16 so that connections and user interface buttons 22 may align with corresponding holes and features 46 in front panel 12, shown in FIG. 5. Insertion guide forks 24 may align with insertion guide notches 42 and guide the mating of the features 22 on the peninsula 16 with the features 46 on the front panel 12 as the printed circuit board 10 is being mated to the front panel 12. Insertion guide forks 26 may also receive and guide the peninsula 16 as the printed circuit board 10 is being mated with the front panel 12.

Figure 3:
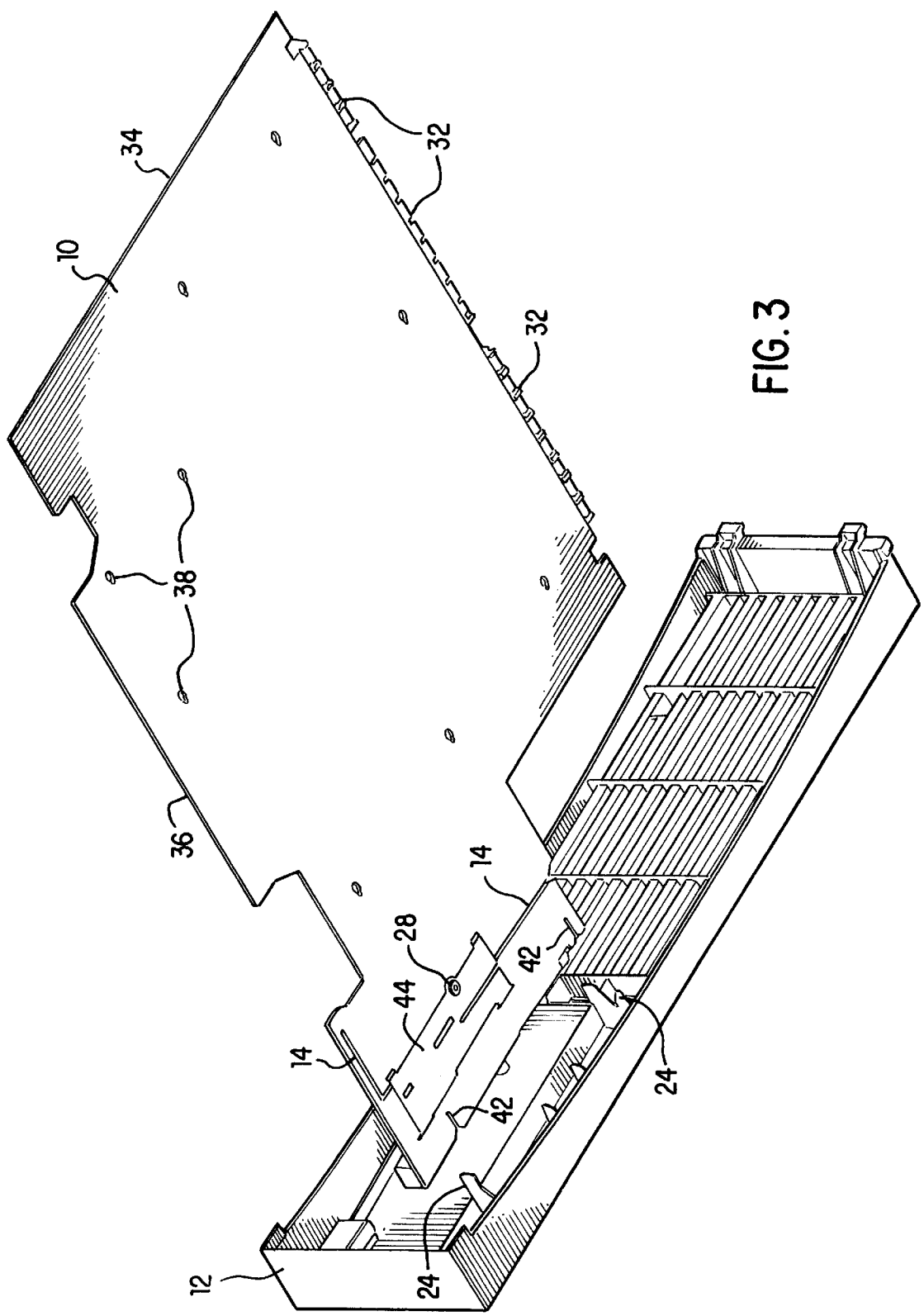
FIG. 3 shows a bottom, rear isometric view of the printed circuit board with a travel limit stop bracket being mounted to the front panel of a computer chassis according to the first embodiment of the present invention.
Figure 4:
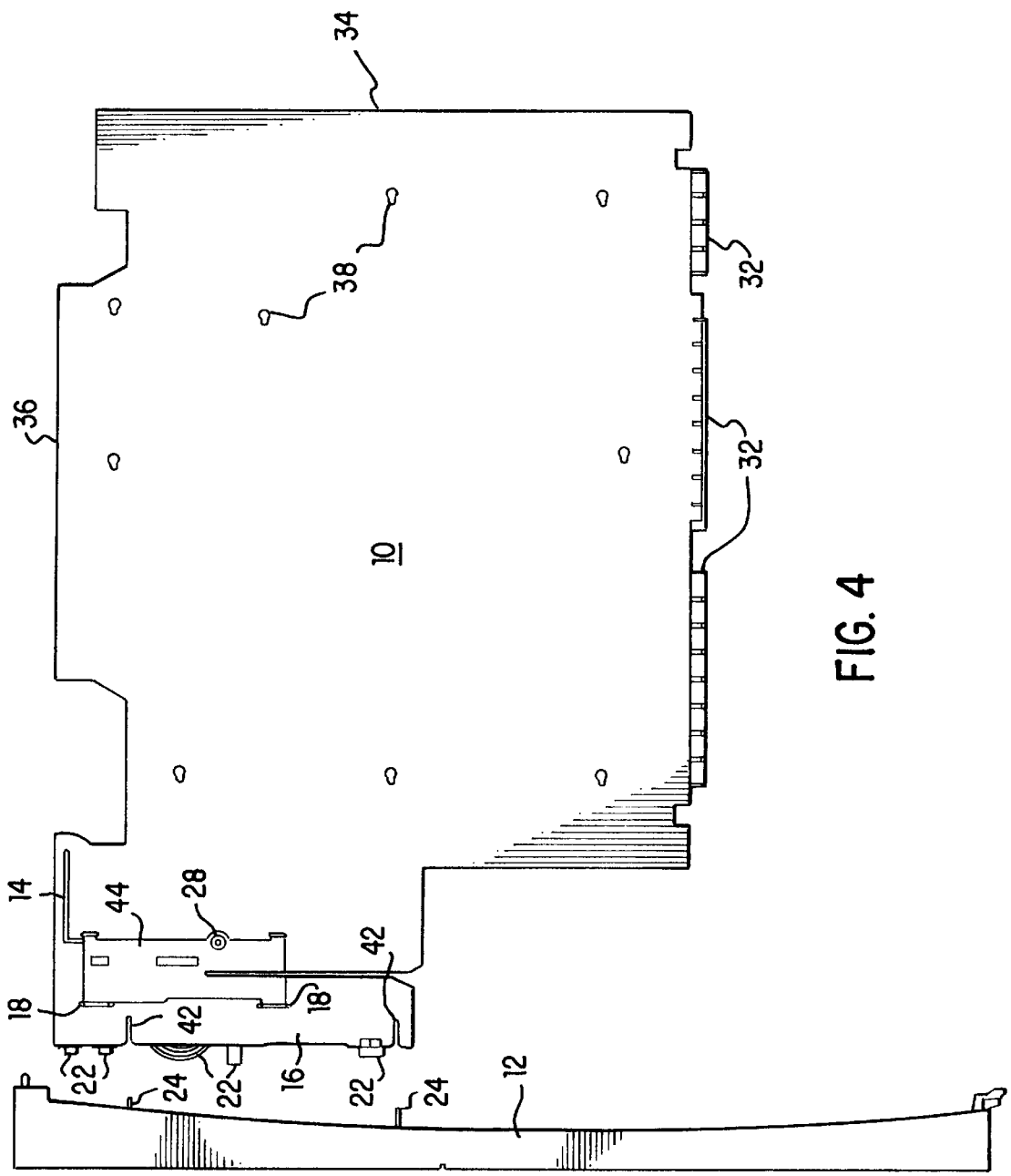
FIG. 4 shows a bottom view of the printed circuit board with a travel limit stop bracket being mounted to the front panel of a computer chassis according to the first embodiment of the present invention.

FIGS. 3, 4 and 5 show a bottom isometric view of the printed circuit board 10 with a travel limit bracket 44 attached to the printed circuit board 10 with a screw or rivet at 28. The travel limit bracket 44 is attached to the printed circuit board 10 relatively securely by the screw or rivet at 28 and prongs 31 that extend through holes 30 in printed circuit board 10 (shown in FIG. 6). Flanges 20 extend through and wrap around slits 18 in the peninsula 16.

Figure 6:
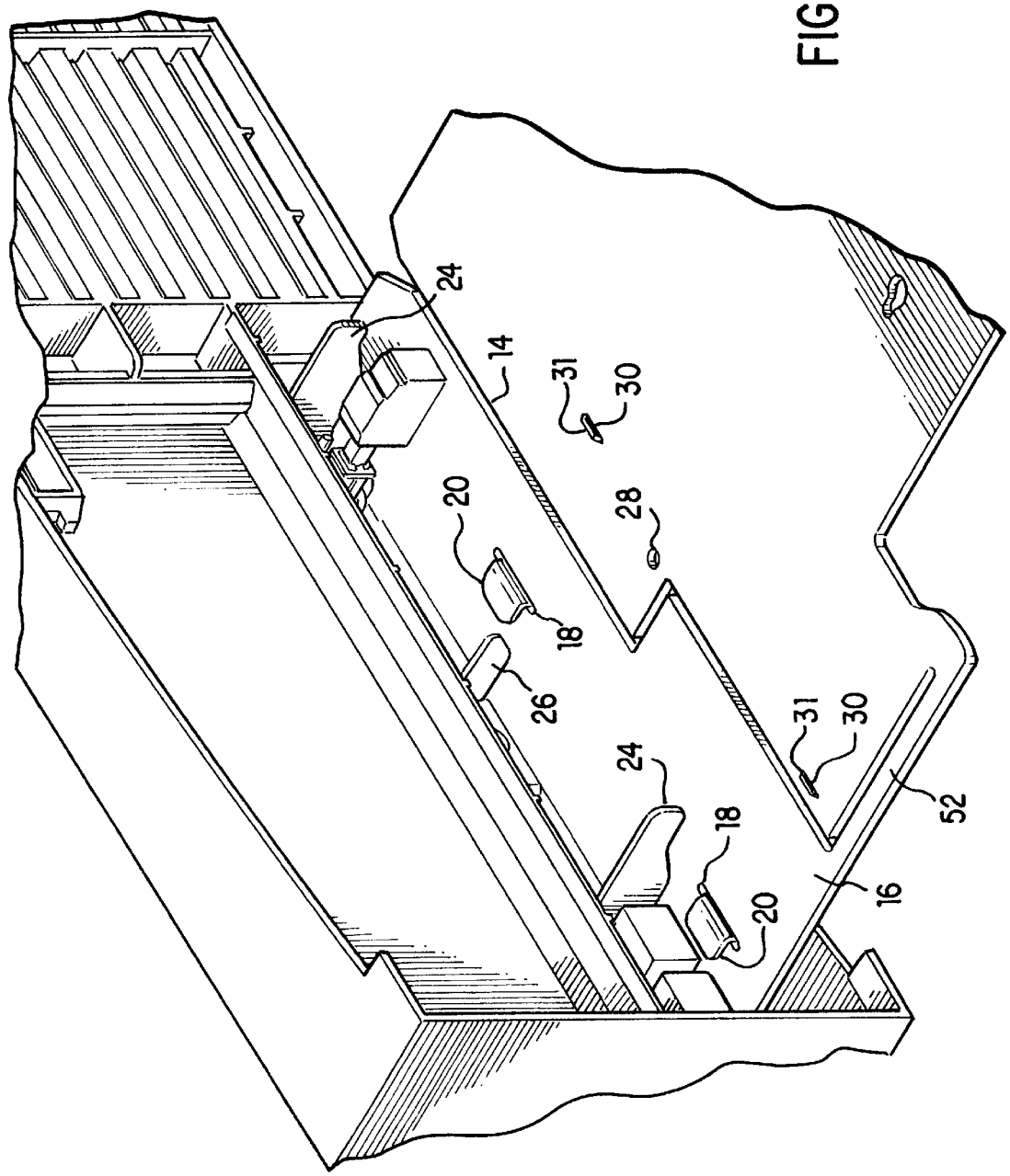
FIG. 6 shows a blown-up, top isometric view of the printed circuit board mounted to the front panel of a computer chassis according to the first embodiment of the present invention.

FIG. 6 shows the printed circuit board 10 mated with the front panel 12, such that alignment forks 24 and 26 engage the insertion guide notches 42 and the printed circuit board 10 along the peninsula 16. During mating of the front panel 12 and the printed circuit board 10, the travel limit bracket 44 provides gross alignment means, while the slot 14 and the isthmus 52 along with insertion guide forks 24 and 26 and insertion guide notches 42 provide fine alignment means.

As can be seen in FIG. 6, slits 18 are longer and wider than flanges 20, and the flanges 20 extend slightly beyond the peninsula 16 before wrapping back parallel to it, which allows for some movement of the peninsula 16 relative to the travel limit bracket 44 and the main body of the printed circuit board 10. Accordingly, the peninsula 16 is permitted slight movement upward, downward, longitudinally and rotationally. Yet, the travel limit bracket 44 prevents the peninsula 16 and the isthmus 52 from excessive movement and twisting that may result in damage to traces, devices or circuits on the printed circuit board or to the printed circuit board itself. Bracket 44 allows for a limited amount of travel and rotation, while still protecting the floating peninsula region 16 of the printed circuit board 10 from damage during manufacturing, mating with the front panel 12, jarring of the computer chassis, etc.

Travel limit bracket 44 may be made of a rigid material, such as steel, aluminum, plastic, etc. Holes 28 and 30, slits 18, insertion guide notches 42 and isolation slot 14 may be made by means of etching, saw, machining, punching or other known cutting method. Insertion guide forks 24 and 26 may be any rigid material, but preferably are plastic and are integral with and formed at the same time as the front panel 12, typically by means of injection molding.

It should also be noted that travel limit bracket 44 could be fixedly attached to peninsula 16 by means of a screw or rivet and slidingly attached to the main body of printed circuit board 10 by means of slits 18 and flanges 20. Also, the means for fixedly attaching the travel limit bracket 44 to the printed circuit board 10 on one side of isolation slot 14 could be any known means of attachment, such as glue, rivets, screws, semi-permanent or snap fit, weld, etc. The travel limit bracket 44 is not a necessary component, if the isthmus 52 is designed wide enough to flexibly support the peninsula region 16 without undo risk of damage to the peninsula, circuitry, traces or the printed circuit board itself.

Figure 7:
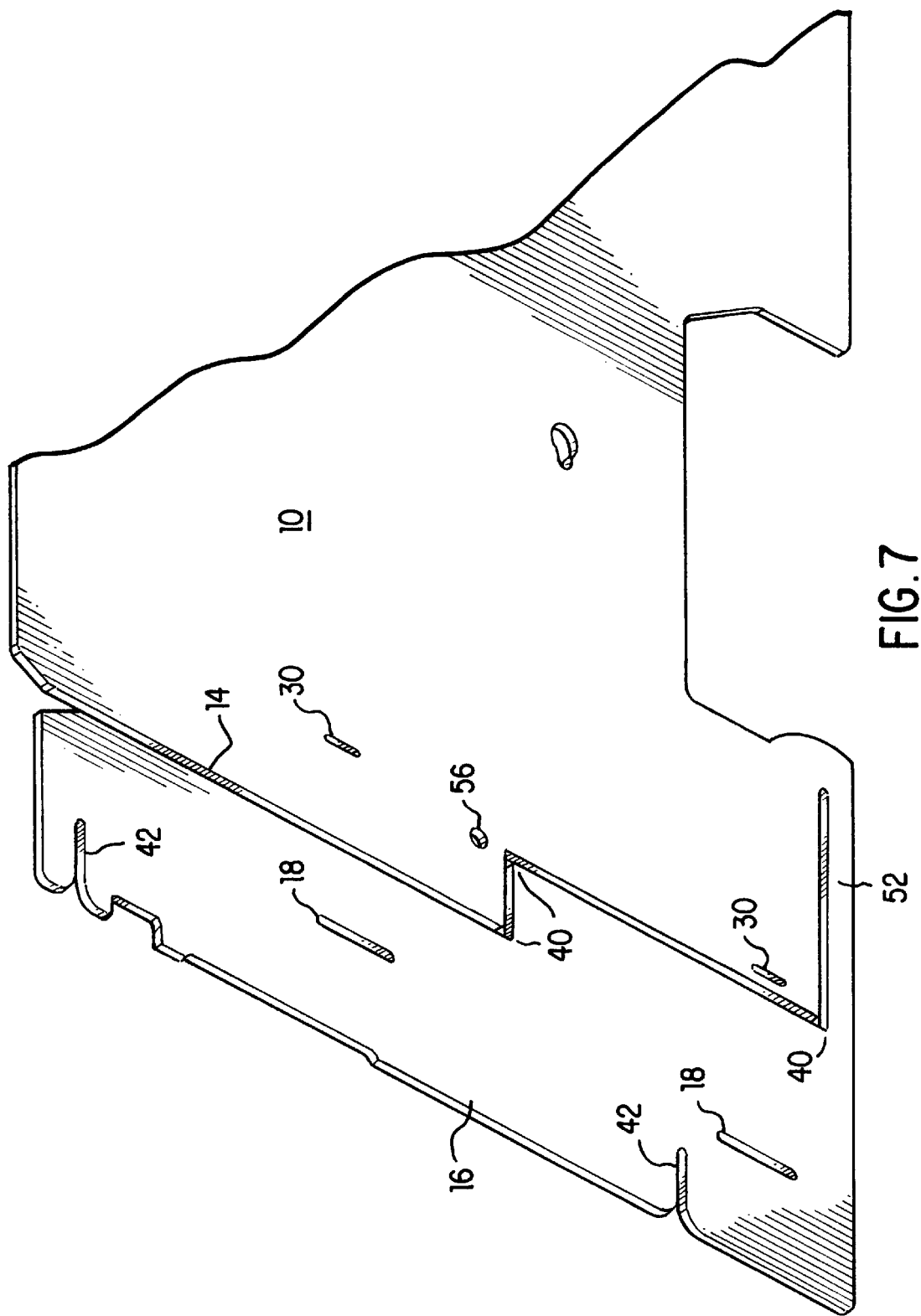
FIG. 7 shows a blown-up, top isometric view of the printed circuit board without the travel limit stop bracket according to the first embodiment of the present invention.
Figure 8:
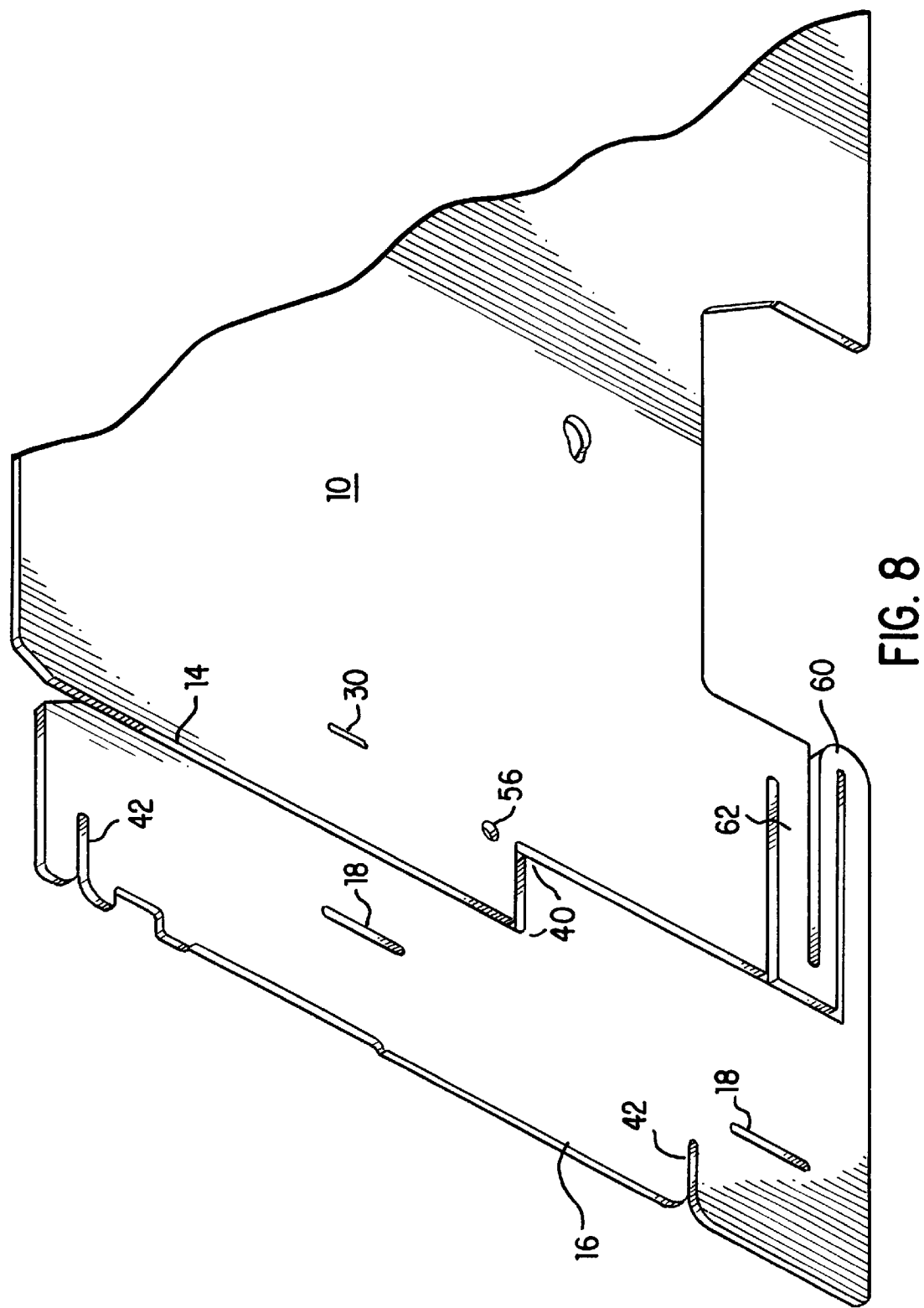
FIG. 8 shows a blown-up, top isometric view of the printed circuit board without the travel limit stop bracket according to a second embodiment of the present invention.
Figure 9:
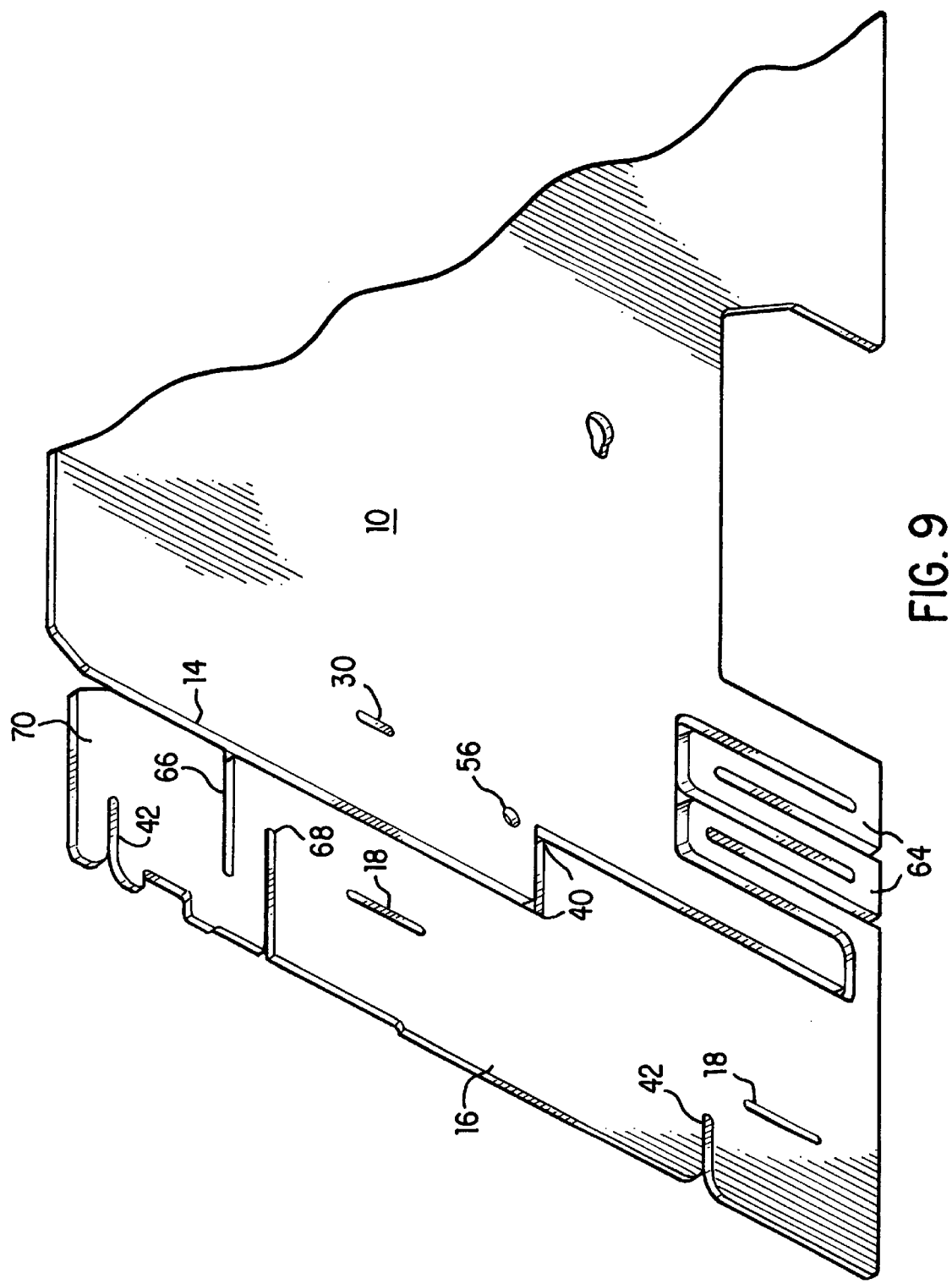
FIG. 9 shows a blown-up, top isometric view of the printed circuit board without the travel limit stop bracket according to a third embodiment of the present invention.

FIG. 7 shows the printed circuit board 10 and peninsula 16 without the travel limit bracket 44. As can be seen in FIGS. 8 and 9, other patterns for isolation slot 14 are possible, in order to provide more degrees of travel or in order to circumvent details and circuitry on the printed circuit board 10. Additional "switch backs" can be added to provide more travel to peninsula 16 as the hairpin turns 60 shown in FIG. 8. FIG. 9 shows another switchback pattern 64 that isolation slot 14 may have. FIG. 9 also shows a second set of slots 66 and 68 on the peninsula 16, which creates a second peninsula region 70 on the first peninsula region 16, allowing for even greater degrees of movement and alignment between the I/O connections and user interface buttons 22 of the printed circuit board 10 and the features 46 on the front panel 12 of the computer chassis.

The limiting factors to the many different ways in which the isolation slots may be designed are how much degree of movement and rotation is desired versus how much protection of the peninsula, circuitry, traces, devices, etc. is desired. Also, the placement of the isolation slot on the printed circuit board may need to take into account the placement of devices, traces, circuitry, I/O connections, etc. Although only one peninsula is described herein, a printed circuit board may include more than one slot and resulting peninsula in order to obtain the necessary alignment to the many connections that a printed circuit board requires. Slot 14 only needs to be wide enough to avoid contact with the printed circuit board 10 when flexing.

Referring back to FIGS. 1 and 2, an additional feature may include a photo diode switch 80 that may be tripped by one of the prongs of insertion guide fork 24. This safety feature prevents the computer from being turned on if the front panel 12 is not properly attached to the computer chassis, thus, protecting the end user from possible electrical shock and the internal components from damage during operation. Also, the photo diode switch 80 may be used to inform the end user if the front panel 12 is improperly mated with the peninsula region 16, possibly due to the peninsula region 16 being pushed out of the way of proper mating with the front panel by a feature on the front panel, such as the insertion guide fork 24.

The foregoing description of the present invention has been presented for purposes of illustration and description. It is not intended to be exhaustive or to limit the invention to the precise form disclosed, and other modifications and variations may be possible in light of the above teachings. For example, although the present invention was described with the floating peninsula region 16 mated to the front panel 12 of the computer chassis, the floating region could also be the region of the printed circuit board mated to the back plane or mother board, etc. Also, any of the orientations used in this specification, such as front, back, up, down, etc., were used merely for ease of description ans should not limit the scope of the invention. Moreover, although the present invention was described with respect to a computer having a printed circuit board, it could readily apply to any device having a printed circuit board that must align with and mate to more than one device on more than one edge of the printed circuit board, such as a monitor, multi-media box, television, electronic game, etc.

Still further, the insertion guide means may be pins and corresponding holes or other known types of guide features such as the holes 46 on the front panel having lead in that guides the features 22 on the printed circuit board 10 as the printed circuit board 10 is mated with the front panel 12 of the computer chassis. Also, the photo diode switch may be any type of electrical or mechanical switch or trip that is apply to transmit the information as to whether the printed circuit board 10 is properly mated with the front panel 12 of the computer chassis. Also, the switch may be on either the peninsula region and tripped by any feature on the front panel during proper mating of the peninsula region to the front panel or the switch may be on the front panel and tripped by any feature on the peninsula region of the printed circuit board during normal mating of the peninsula and the front panel.

The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A device comprising:

a means aligning a printed circuit board inside a chassis of an electronic device, said printed circuit board having two sides and more than one connection edge, said printed circuit board is mated with more than one device along more than one connection edge, said means aligning said printed circuit board inside said electronic device comprising:

an isolation slot creating a peninsula connection region near one of said connection edges of said printed circuit board, said peninsula region of said printed circuit board connected to a main region of said printed circuit board by means of an isthmus created by said isolation slot, such that when said printed circuit board is mated with devices along more than one connection edge, said isolation slot permits said peninsula connection region to flex and align and mate with at least one device along said peninsula connection region.

2. The device according to claim 1 and further comprising:

a travel limit bracket, said travel limit bracket is fixedly attached to said printed circuit board on one side of said isolation slot and slidingly attached to said printed circuit board on a second side of said isolation slot, such that said travel limit bracket permits a limited amount of movement and twisting of said isthmus and said peninsula connection region relative to said main body of said printed circuit board.

3. The device according to claim 1 and further comprising:

insertion guides integral with said peninsula connection region of said printed circuit board; and insertion guides integral with said chassis of said electronic device, such that when said peninsula connection region is mated with said chassis of said electronic device, said insertion guides integral with said peninsula connection region and said insertion guides integral with said chassis provide fine alignment and guide the mating of said peninsula connection region to said chassis of said electronic device.

4. The device according to claim 1 and further comprising:

a photo diode switch on said peninsula connection region of said printed circuit board, wherein said photo diode switch is tripped by a feature on said chassis when said peninsula connection region of said printed circuit board is mated with said chassis.

5. The device according to claim 1 and further comprising:

a photo diode switch on said chassis, wherein said photo diode switch is tripped by a feature on said peninsula connection region of said printed circuit board when said peninsula connection region of said printed circuit board is mated with said chassis.

* * * * *